US009368209B2

(12) United States Patent
Milani et al.

(10) Patent No.: US 9,368,209 B2
(45) Date of Patent: *Jun. 14, 2016

(54) EMBEDDED NON-VOLATILE MEMORY WITH SINGLE POLYSILICON LAYER MEMORY CELLS PROGRAMMABLE THROUGH CHANNEL HOT ELECTRONS AND ERASABLE THROUGH FOWLER-NORDHEIM TUNNELING

(71) Applicant: STMICROELECTRONICS S.R.L., Agrate Brianza (IT)

(72) Inventors: Luca Milani, Mairano (IT); Fabrizio Torricelli, Brescia (IT); Anna Richelli, Brescia (IT); Luigi Colalongo, Bertinoro (IT); Zsolt Miklos Kovàcs-Vajna, Brescia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/605,246

(22) Filed: Jan. 26, 2015

(65) Prior Publication Data
US 2015/0221371 A1 Aug. 6, 2015

(30) Foreign Application Priority Data

Feb. 20, 2014 (IT) .................. MI2014A0156

(51) Int. Cl.
| G11C 16/10 | (2006.01) |
| G11C 16/04 | (2006.01) |
| H01L 27/115 | (2006.01) |
| H01L 21/28 | (2006.01) |
| H01L 29/66 | (2006.01) |
| H01L 29/788 | (2006.01) |

(52) U.S. Cl.
CPC ...... *G11C 16/0408* (2013.01); *H01L 21/28273* (2013.01); *H01L 27/11519* (2013.01); *H01L 27/11521* (2013.01); *H01L 27/11558* (2013.01); *H01L 29/66825* (2013.01); *H01L 29/7881* (2013.01)

(58) Field of Classification Search
CPC ............................ G11C 16/10; G11C 16/0438
USPC ......................................... 365/185.28, 185.24
See application file for complete search history.

(56) References Cited

U.S. PATENT DOCUMENTS

| 5,761,126 A | 6/1998 | Chi et al. |
| 5,940,324 A | 8/1999 | Chi et al. |
| 6,750,527 B1 * | 6/2004 | Momohara ...... G01R 31/31721 257/355 |
| 6,930,002 B1 | 8/2005 | Chen et al. |

(Continued)

*Primary Examiner* — Michael Tran
(74) *Attorney, Agent, or Firm* — Allen, Dyer, Doppelt, Milbrath & Gilchrist, P.A.

(57) ABSTRACT

A non-volatile memory includes memory cells arranged in rows and columns. Each memory cell includes a program/read portion and an erase portion that share an electrically floating layer of conductive material defining a first capacitive coupling with the program/read portion and a second capacitive coupling with the erase portion. The first capacitive coupling defines a first capacitance greater than a second capacitance defined by the second capacitive coupling. The erase portion is configured so that an electric current extracts charge carriers from the electrically floating layer to store a first logic value in the memory cell. The program/read portion is further configured so that an electric current injects charge carriers in the electrically floating layer to store a second logic value in the memory cell.

18 Claims, 11 Drawing Sheets

(56) References Cited

U.S. PATENT DOCUMENTS

| | | | |
|---|---|---|---|
| 6,985,386 B1 * | 1/2006 | Mirgorodski | G11C 16/0416 257/E21.694 |
| 7,233,526 B2 * | 6/2007 | Umezawa | G11C 16/12 257/E21.682 |
| 7,471,572 B1 * | 12/2008 | Bu | G11C 16/14 365/185.22 |
| 7,671,401 B2 * | 3/2010 | Fang | G11C 16/0416 257/318 |
| 8,125,835 B2 * | 2/2012 | Hirose | G11C 16/12 365/126 |
| 8,533,562 B2 * | 9/2013 | Mee | G06F 11/1441 711/103 |
| 8,693,256 B2 | 4/2014 | Pasotti et al. | |
| 9,230,667 B2 * | 1/2016 | Park | G11C 7/1006 |
| 9,230,675 B2 * | 1/2016 | Yang | G11C 11/5642 |
| 9,240,239 B2 * | 1/2016 | Kang | G11C 16/0483 |
| 9,256,530 B2 * | 2/2016 | Oh | H01L 27/11524 |
| 2007/0296034 A1 | 12/2007 | Chen et al. | |
| 2009/0080257 A1 | 3/2009 | Oka et al. | |
| 2011/0157977 A1 | 6/2011 | Pasotti et al. | |
| 2013/0343128 A1 * | 12/2013 | Torricelli | H01L 29/42324 365/185.14 |
| 2015/0221372 A1 * | 8/2015 | Milani | G11C 16/0408 365/185.28 |
| 2015/0221661 A1 * | 8/2015 | Milani | H01L 27/11521 257/321 |

* cited by examiner

US 9,368,209 B2

EMBEDDED NON-VOLATILE MEMORY WITH SINGLE POLYSILICON LAYER MEMORY CELLS PROGRAMMABLE THROUGH CHANNEL HOT ELECTRONS AND ERASABLE THROUGH FOWLER-NORDHEIM TUNNELING

TECHNICAL FIELD

The present invention relates to the field of electronics. More specifically, the present invention relates to non-volatile memory devices.

BACKGROUND

Non-volatile memory devices are used in any application for the storage of information that must be maintained even when the memory devices are not powered. In recent years, the market for integrated non-volatile memories (or embedded non-volatile memory—emNVM) has undergone considerable development. The emNVM are implemented with other devices on a single chip in order to obtain (electronic) Systems-on-Chip (SoC). The emNVM are implemented in the SoCs, for example, to allow calibration/adjustment during post-production (e.g., for analog and/or radio-frequency circuits) by the manufacturer and/or post-production customisation/configuration by the final user. Moreover, the NVM are implemented in SoCs that store a limited amount of data in systems such as radio frequency identification (RFID).

Several technological approaches are available to create an emNVM. Some approaches allow a single programming (or One Time Programmable) of the emNVM, such as a polyfuse or anti-fuse type emNVM.

Other technological approaches allow the performing more write cycles on the emNVM, such as in the case of EEPROM (Electrical Erasable and Programmable Read-Only Memory) or FLASH emNVMs, which store a datum by trapping electric charges in an insulated, or floating terminal (floating gate), of a storage transistor.

However, these types of memory cells use technologies and processes generally not comprised in the CMOS standard (to provide floating gate transistors) usually used to implement SoCs. In fact, the storage transistors include an additional polysilicon layer to define regions of their floating gates (in addition to that used to define their gate regions of control as in the standard CMOS). This difference adds complexity of design, which significantly increases the manufacturing cost of the memory devices.

In the art, memory cells of floating gate type obtainable using standard CMOS processes have been developed. For example, single-poly EEPROM (or single polysilicon EEPROM) were developed, which may be implemented in standard CMOS technology since they require only one layer of polysilicon.

In these memory cells, the floating gate is made from a single layer of polysilicon shared between a control capacitor, which dominates and controls the potential of the gate terminal of a MOS transistor connected thereto by capacitive coupling. The programming and erasing of the cell may occur by injection of hot carriers (Hot Carrier Injection—HCI), such as channel hot electrons (Channel Hot Electron—WHO), or by Fowler-Nordheim (FN) tunneling in the floating gate in the proximity of the drain region of the floating gate transistor. Italian patent application No. MI2009A002349 by the same Applicant describes an emNVM that implements single-poly type memory cells.

Such memory cells require control circuitry (e.g., row decoders and column, read and write unit, etc.) that are rather complex (and of considerable dimensions on the chip) since they must be able to generate and provide to each cell comprised in a matrix of the emNVM a plurality of different voltages, also of high value (as compared to a supply voltage of the SoC in which the emNVM is integrated).

SUMMARY

In general terms, the approach according to one or more embodiments of the present invention provides an emNVM comprising a matrix of memory cells compact and addressable and with reduced voltage values to simplify a control structure necessary to operate on the matrix of memory cells with respect to known emNVMs.

Particularly, one or more aspects of the approach according to specific embodiments of the invention are indicated in the independent claims, with advantageous features of the approach that are indicated in the dependent claims.

More specifically, one aspect of the approach according to an embodiment of the invention provides a non-volatile memory integrated in a chip of semiconductor material. The non-volatile memory comprises a plurality of memory cells arranged in a plurality of rows and columns, each memory cell comprising a program/read portion and an erase portion. The program/read portion and the erase portion share an electrically floating layer of conductive material which performs a first capacitive coupling with the program/read portion, and a second capacitive coupling with the erase portion. The program/read portion of each memory cell is formed in the chip in a first well of semiconductor material having a doping of a first type. The erase portion is formed in the chip in a second well of semiconductor material having a doping of a second type. The program/read portion is configured to be traversed by an electric current or an electric current flowing therethrough indicative of a logic value stored in the memory cell during a read operation of the memory cell. In the approach according to an embodiment of the present invention, the first capacitive coupling defines a first capacitance greater than a second capacitance defined by the second capacitive coupling. Furthermore, the erase portion is configured so that an electric current flows through it that is suitable for extracting charge carriers from the electrically floating layer to impose the storing of a first logic value in the memory cell, and the program/read portion is further configured to have an electric current flow therethrough that is adapted to inject charge carriers in the electrically floating layer to impose the storage of a second logic value, respectively, in the memory cell.

DETAILED DESCRIPTION

An approach according to one or more embodiments of the invention, as well as additional features and its advantages, will be best understood by reference to the following detailed description, given purely by way of non-limiting example, to be read in conjunction with the accompanying figures (in which corresponding elements are indicated with the same or similar references and their explanation is not repeated for brevity). In this respect, it is expressly understood that the figures are not necessarily to scale (with some details that may be exaggerated and/or simplified) and that, unless otherwise indicated, they are simply used to conceptually illustrate the structures and procedures described.

Figure 1:
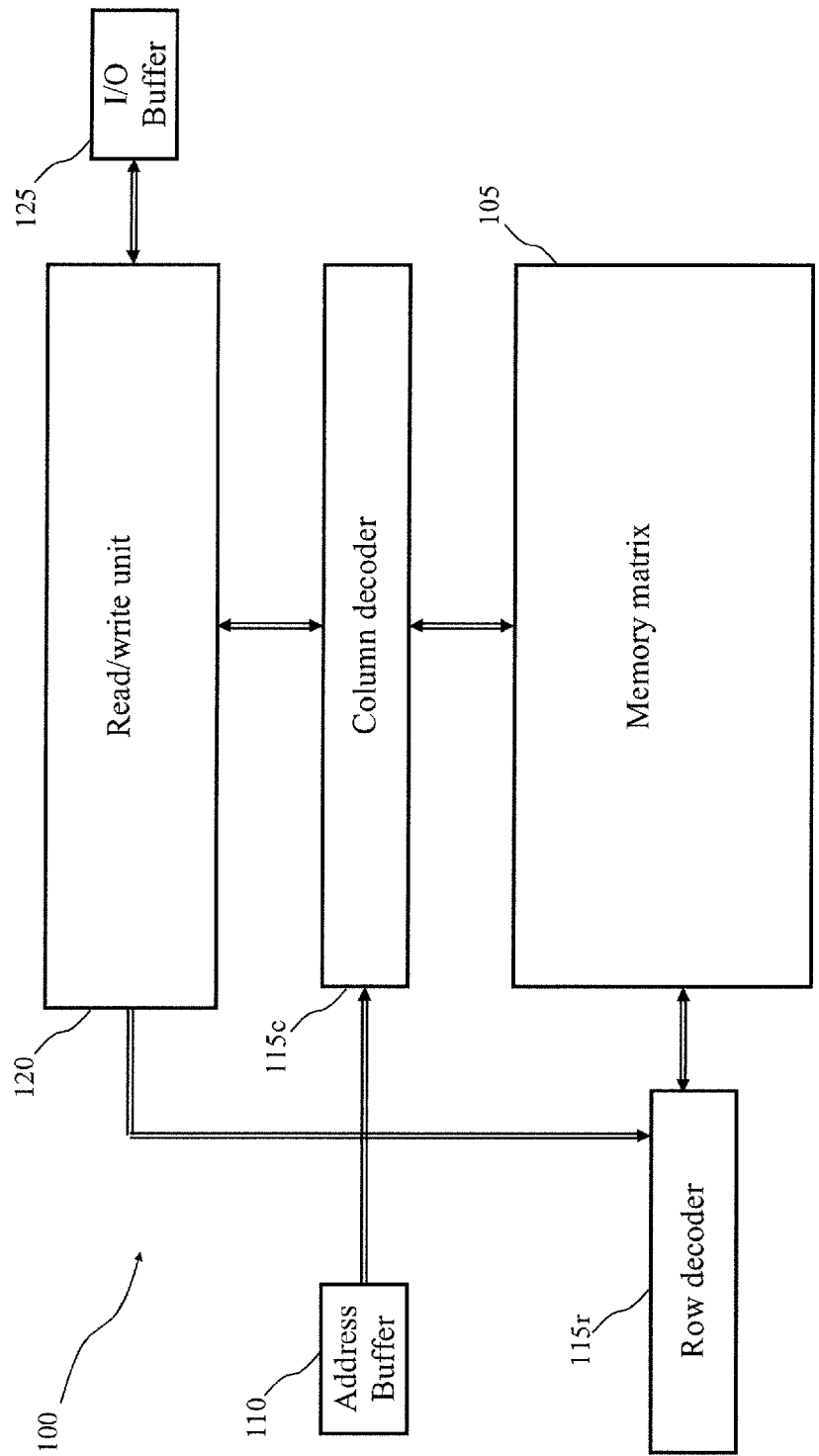
FIG. 1 is a block diagram of an emNVM in which an embodiment of the present invention may be implemented.

With reference to the figures, FIG. 1 is a block diagram of an emNVM in which an approach according to the present invention may be implemented. The memory device 100 is of an integrated non-volatile type, or emNVM (embedded Non Volatile Memory). The memory device 100 comprises an array 105, which is formed by a plurality of memory cells (not shown in the figure) that are organized in rows and columns (for example, 128-512 and 512-1024 rows columns). Each memory cell stores a logic value (e.g., corresponding to a bit of information). For this purpose, the memory cell is based on a floating gate MOS transistor, this transistor has a threshold voltage which depends on an electrical charge in its floating gate. The different levels of the threshold voltage representing corresponding logic values. Conventionally, the memory cell is programmed (to a logic 0 value) when it has a high threshold voltage, while the memory cell is erased (to a logic 1 value) when presents a low threshold voltage.

An address buffer 110 receives an address of a memory cell or a set of memory cells (for example, to a corresponding word) in the array 105. In particular, a portion of the address is supplied to a row decoder 115r, which selects the selected row in the array 105. The other portion of the address is instead supplied to a column decoder 115c, which selects a column in 105 matrix within the columns of the matrix 105. In this way, it is possible to (electrically) access each memory cell matrix 105.

A read/write unit 120 controls the operation of the row decoder 115r and of the column decoder 115c. The read/write unit 120 also comprises all the components (such as power management unit with charge pumps, sense amplifiers, comparators, reference cells, pulse generators, and the like) that are used to write (i.e., program, or erase) the memory cells and read their logic values. The read/write unit 120 is also coupled with a input/output (I/O) buffer 125, the input/output buffer 125 receives data (one or more bits) to be written in the matrix 105, or provides the data read from the matrix 105.

Figure 2A:
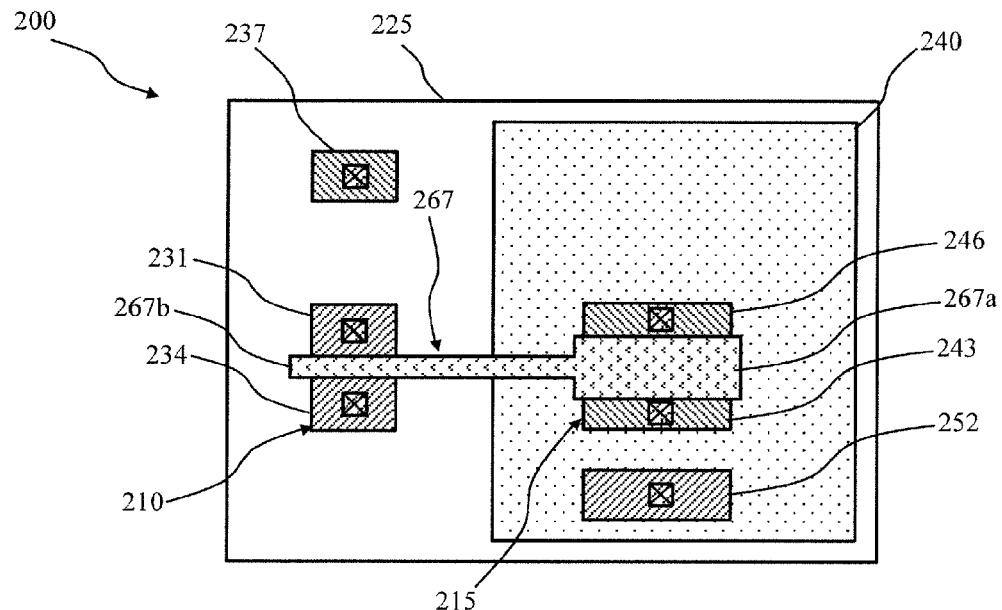
FIG. 2A is a schematic plan view of a memory cell according to one embodiment of the present invention.
Figure 2B:
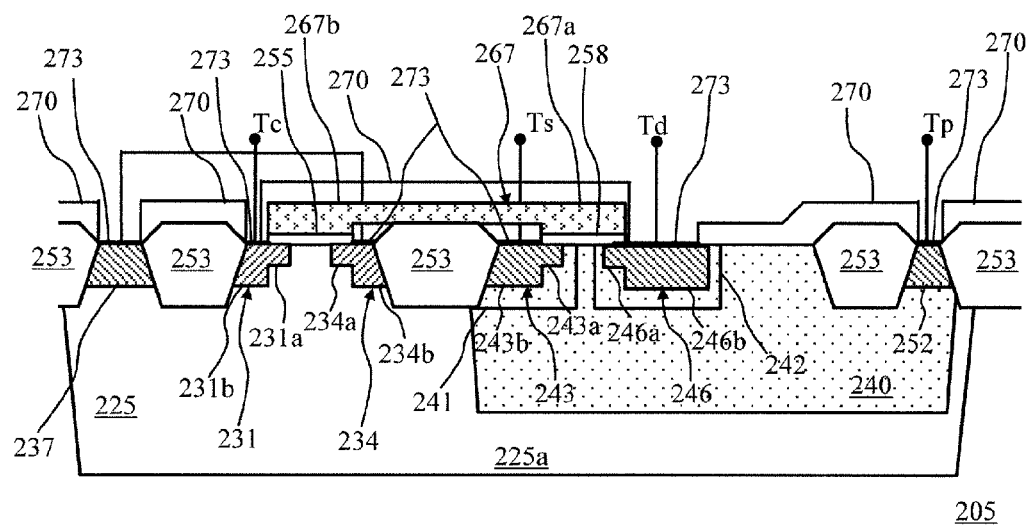
FIG. 2B is a schematic cross-sectional view of the memory cell of FIG. 2A.

Turning now to FIGS. 2A and 2B, a schematic and section views, respectively, of a memory cell 200 according to one embodiment of the present invention are illustrated.

The memory cell 200 is integrated within a portion of substrate 205 of a chip (chip) of semiconductor material (e.g., silicon Si). The portion of the substrate may have a doping of p-type (as in the case of silicon doped with boron B). The memory cell 200 comprises an erase portion which in its turn comprises a capacitive element 210 and a program/read portion that in turn comprises a memory transistor 215.

An n well 225 with a n-type doping (as in the case of silicon doped with phosphorus P) extends from a surface of the chip 228 in the substrate 205 (down to a first depth). Advantageously, the n well 225 comprises a n-type doping deep region 225a with a concentration greater than the doping of the n well 225—n+ doping as indicated in the following. This deep region 225a defines a (lower) boundary with the substrate 205.

Two plate regions 231 and 234 with a p-type doping—type corresponding to a first plate of the capacitive element 210, are formed in the n well 225. The plate regions 231 and 234 have a p-type doping concentration higher than the doping of the substrate 205—identified as p+ doping in the following. Preferably, the plate regions 231 and 234 each comprise an extension portion 231a and 234a, which extend towards each other, in the proximity of the surface 228 and have a p-type doping—indicated as p* doping in the following—different from (for example, lower than) the p+ doping of a main portion 231b and 234b of the plate regions 231 and 234, respectively.

Inside the n well 225 is preferably also formed a n+ contact region 237, having an n+ type doping, to electrically contact the n well. A p well 240 is formed inside the n well 225. The p well 240 extends from the surface of the chip 228 towards the inside of the n well 225 (up to a second depth lower than the first depth).

In the p well 240 are preferably formed three distinct regions, two protection regions 241 and 242 (indicated in the art as pockets or halos) p* doped and, preferably, a p well contact region 252 p+ doped, or simply p+ contact region 252, to electrically contact the p well 240. Within each of the two protection regions 241 and 242 is formed a respective n+ doped region 243 and 246. In the following, the first n+ region is indicated as a source region 243, as it corresponds to the source region of the memory transistor 215, and the second n+ region indicates a drain region 246, as it corresponds to the drain region of the memory transistor 215.

Preferably, the source 243 and drain 246 regions each comprise an extension portion 243a and 246a, which extend towards each other in the vicinity of the surface 228, and have an n-type doping—referred to as n* doping hereinafter—different from (for example, lower than) the n+ doping of a main portion 243b and 246b of the regions 243 and 246, respectively.

A plurality of decoupling insulating elements 253 (e.g., a plurality of Shallow Trench Insulation—STI) are formed at the surface 228 in such a way to extend, with its main portion, towards the inside of the chip and, with a minor portion, above the surface 228 of the chip. Advantageously, the decoupling layer 253 is shaped so as to define a plan view of the wells 225 and 240, thus delimiting and (electrically) isolating the latter between them and other surrounding elements possibly formed in the same chip.

An capacitor insulating layer 255 electrically insulating material (e.g., silicon oxide $SiO_2$) is formed on the surface 228 of the chip, in a space above it, and substantially delimited, the plate regions 231 and 234 (with the extension portions 231a and 234a which extend in the n well 225 beneath the capacitor insulating layer 255).

Similarly, a memory insulating layer 258 of electrically insulating material is formed on the surface 228 of the chip, in a space thereabove, and substantially delimited by, the regions 243 and 246 (so as to form the oxide layer of the memory transistor 215 and with the extension portions 243a and 246a which extend in the p well 240 below the insulating layer of the cell 258).

An electrically floating coupling layer 267 of polysilicon—hereinafter referred to as the floating layer 267 for simplicity—is formed between the capacitor insulating layer 255 and the insulating layer of the cell 258. In this way, a capacitor portion 267a of the floating layer 267 forms a second plate of the capacitive element 210 while a transistor portion 267b of the floating layer 267 forms the gate region of the memory transistor 215. The floating layer 267 is completely covered by an insulating layer (not shown, for example made of silicon oxide and/or other compounds as insulating silicon nitride).

One or more oxide layers 270 (e.g., a layer of silicon oxide and/or silicon nitride) are formed in such a way to cover (and electrically insulate) the floating layer 267, the gate layer 264 and the insulating layers 255, 258 and 261. The floating layer 267 is completely electrically isolated from what formed in the substrate 205 because of the oxide layers 270.

In correspondence of the regions 237, 231, 234, 243, 246 and 252 are formed respective layers of salicide 273 in a metallic material (e.g., cobalt defined as transition metal) in order to facilitate a subsequent electrical connection with metal elements for electrical connection formed later by higher metallization layers.

Preferably, the regions 237, 231, 234, 243, 246 and 252 are connected to the upper metallization layers (shown schematically by a line in FIG. 2B) so as to form the corresponding control Tc (connected to both plate regions 231 and 234 and to the n+ contact region 237), source Ts, drain Td, p well Tp terminals in order to be able to be electrically connect to elements external to the memory cell 200 (e.g., the row decoder 115r and the column decoder 115c shown in FIG. 1).

Based upon the structure described above, the memory cell 200 (in particular because of the deep region 225a) does not significantly electrically interact with the substrate 205 of the chip in which it is integrated. Therefore, the memory cell 200 is substantially electrically isolated from any other memory cells 200 and/or other devices (not shown) formed in the substrate 205 (and therefore electromagnetic interference between the memory cells 200 formed in the substrate 205 are suppressed or at least substantially reduced).

In one embodiment, the floating layer 267 is formed so as to define a capacitive coupling factor α between a predetermined capacitance Cc of the capacitive element 210 and a capacitance Ct of the memory transistor 215. The floating layer 267 is formed with a transistor portion 267a having a size (an area) larger than the size of a capacitive portion 267b. Preferably, the size of the portions 267a and 267b are selected so as to obtain a capacitive coupling factor α equal to:

$$\alpha = \frac{Cc}{Cc + Ct} \leq 0.5; (e.g., \alpha = 0.2). \quad (1)$$

In other words, the capacitive coupling factor α tending to zero (i.e., opposite to a value of capacitive coupling defined in the memory cells known in which a capacitive coupling factor tends to unit) makes the floating layer 267 (corresponding to the floating region of a classic floating gate transistor) coupled, from electrical point of view, mainly to its p+ contact region 252 rather than the n+ contact region 237.

Based upon the structure described above and the resulting capacitive coupling α, it is possible to perform an erase operation (imposing a logic 1 value as stored data) of the memory cell 200 by the Fowler-Nordheim tunneling (or FN tunneling) phenomenon. A program operation (imposing a logic 0 value as stored data) of the memory cell 200 is performed by the channel hot electron (CHE) phenomenon.

Based upon the structure of the memory cell 200, the FN tunneling occurs in correspondence of the capacitor insulating layer 255 (i.e., the extraction of charge carriers from the floating layer 267 is performed through the control terminal Tc connected to the capacitive element 210). Differently, CHE occurs in correspondence of the memory insulating layer 258 (i.e., the injection of charge carriers from the floating layer 267 is performed through the drain terminal Td connected to the drain region 246 of the memory transistor 215).

After having described the structure of the memory cell 200, an operation thereof according to one embodiment is described. The memory cell 200 may be controlled by applying appropriate voltages to the terminals Tc, Ts, Td, and Tp. According to the value of the applied voltages, the memory cell 200 may be controlled to store the logic 1 value, through the erase operation, to store the logic 0 value, through the program operation, or to detect a previously stored value, through a read operation.

Table 1 below is an example of biasing schemes applicable to terminals Tc, Ts, Td and Tp of the memory cell 200 according to the selected operation between the erase, program and read operations.

TABLE 1

|  | Tc | Tp | Ts | Td |
| --- | --- | --- | --- | --- |
| Erase | Ve | GND | GND | GND |
| Program | Vp | GND | GND | Vp |
| Read | Vr | GND | GND | Vd |

To perform the erase operation, the control terminal Tc is brought to an erase voltage Ve of high value (e.g., Vc=15V for a technology with a supply voltage Vdd comprised between 3V and 5V), while the other terminals Ts, Td and Tp are all maintained at a value of reference voltage GND (for example, GND=0V).

In this configuration, because of the capacitive coupling factor α, an electric potential of the floating layer 267 is close to a potential of the p well terminal Tp (namely, GND in the example considered). The electric potential of the capacitor portion 267b of the floating layer 267 is substantially different from (particularly, it is substantially lower than) the erase voltage Ve value which biases the control terminal Tc. Consequently, the potential drop on the capacitor insulating layer 255 (substantially corresponding to Ve in the considered example) has such an intensity to activate a FN tunneling electric current through the capacitor insulating layer 255, of such an intensity to extract electrons trapped in the floating layer 267 (thereby imposing the logic 1 value in the memory cell 200).

The plate regions 231 and 234, through the extension portions 231a and 234a, generating an electric field when biased via the control terminal Tc to the erase voltage Ve. This electric field extends in the region of the n well 225 below the capacitor insulating layer 255 (also referred to as the channel region). The electric field has an intensity such as to determine an extraction of electrons stored in the floating layer 267 substantially uniform in the channel region (in a similar way to what happens in the floating gate transistors implemented in FLASH memories).

The program operation takes advantage of the CHE, which takes place mainly through the insulating layer 258 near the extension portion 246a of the source region 246. In order to promote the CHE, the control terminal Tc and the drain terminal Td are brought to a voltage value higher than the voltage value applied to the remaining terminals Ts and Tp.

For example, as reported in Table 1, a value of the program voltage Vp, substantially corresponding to a supply voltage value Vdd (Vp=Vdd), may be applied to the control terminal Tc and to the drain terminal Td, while the terminals Ts and Tp are maintained at the reference voltage GND.

During the program operation, a fraction Iche (generated by CHE) of the electric current Id flowing between the drain region 246 and the source region 243 is injected into the floating layer 267 through the capacitor insulating layer 255 by CHE (in other words, by CHE charge carriers that are injected into the floating layer 267, thereby forcing the logic 0 value in the memory cell 200). The protection regions 241 and 242 allow the execution of the program operation at the program voltage Vp without causing undesirable phenomena such as the punch-through phenomenon known in the art.

The read operation of the data stored is done by measuring a drain current Id of the memory transistor 215, generated by biasing to a read voltage Vr value the control terminal Tc and biasing to a drain voltage Vd value the terminal Td, while the terminals Ts and Tp are maintained at the reference voltage GND. On the basis of the measured value of the current Id is possible to extrapolate the value of the threshold voltage of the memory transistor 215, and then the logic value stored in the memory cell 200 (in other words, the current Id provides an indication of the logic value stored in the memory cell 200).

In one embodiment, the current Id may provide an indication of the logic value stored in an indirect way. For example, the threshold voltage of the memory transistor 215 may be determined from the value of voltage Vr to be applied to terminals Tc and Tn, maintaining the terminal Td to the constant voltage value Vd (e.g., Vd=1V), in order to measure a known current Id (e.g., Id=10 μA). The memory cell 200 just described is fully achievable with a single polysilicon layer 267 (i.e., by processes included in standard CMOS technology).

Figure 3A:
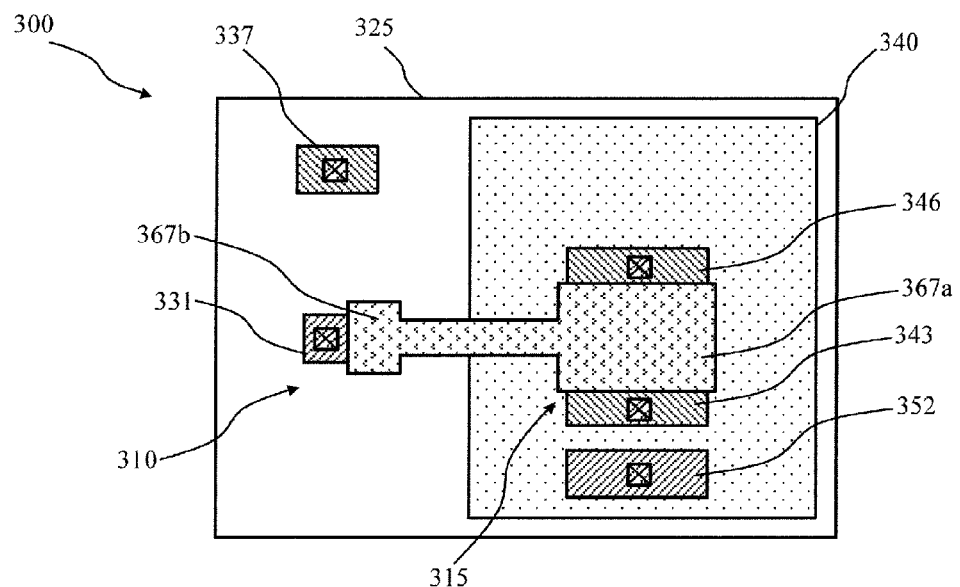
FIG. 3A is a schematic plan view of a memory cell according to a different embodiment of the present invention.
Figure 3B:
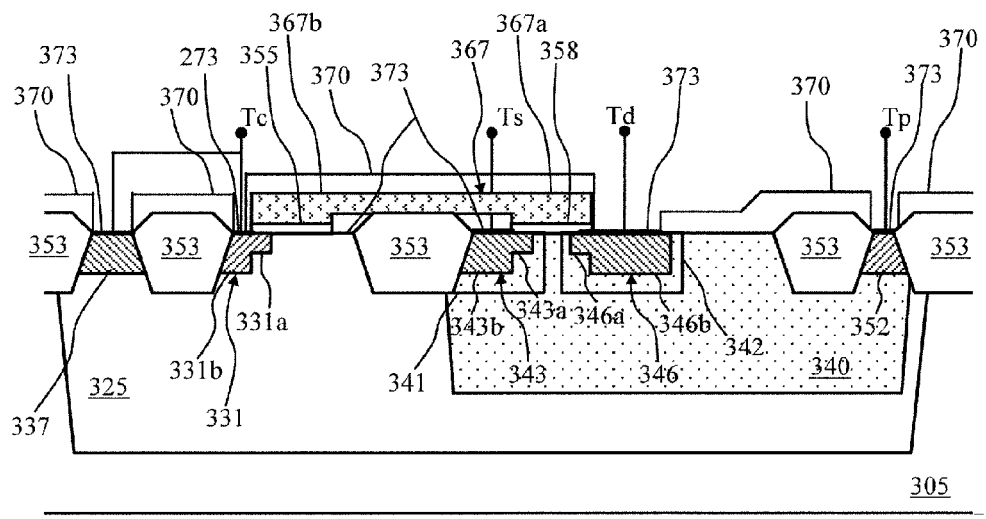
FIG. 3B is a schematic cross-sectional view of the memory cell of FIG. 3B.

Turning now to FIGS. 3A and 3B, a memory cell 300 according to one embodiment is illustrated. The memory cell 300 differs from memory cell 200 as follows (note that elements of the memory cell 300 corresponding to elements of the memory cell 200 are indicated by similar references and their description is not repeated for brevity).

The memory cell 300 comprises a single plate region 331 (instead of the two regions 231 and 234 present in the memory cell 200), comprising an extension portion 331a of the p* type extending under the substrate 355 and a main portion 331b (similarly to what is described above with reference to the regions 231 and 234).

The plate region 331, defines in the region of the n well 325 below one end of the capacitor insulating layer 355 when an electric field biased via the control terminal Tc to the value of erase voltage Ve. The electric field has an intensity such as to determine an extraction of electrons stored in the floating layer 367 substantially concentrated in a overlap region among the plate region 331 (and a portion adjacent to the latter of the channel region), the capacitor insulating layer 355 and the floating layer 367 (in a similar way to what happens in the floating gate transistors implemented in EEPROM memories).

The structure of the capacitive element 310 thus obtained allows to obtain a memory cell 300 more compact than the memory cell 200, while substantially maintaining the same operation characteristics described above.

Figure 4A:
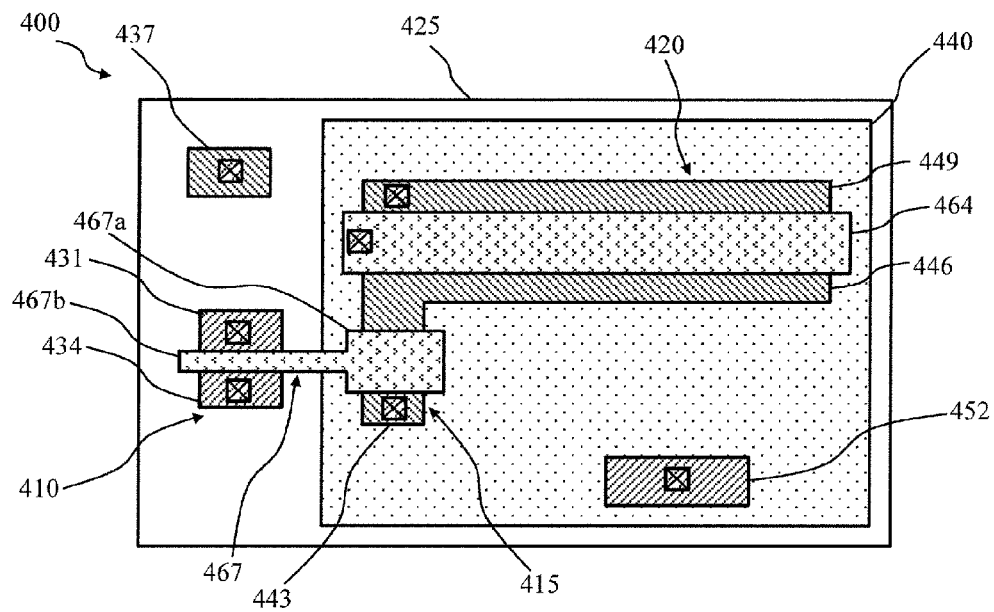
FIG. 4A is a schematic plan view of a memory cell according to an alternative embodiment of the present invention.
Figure 4B:
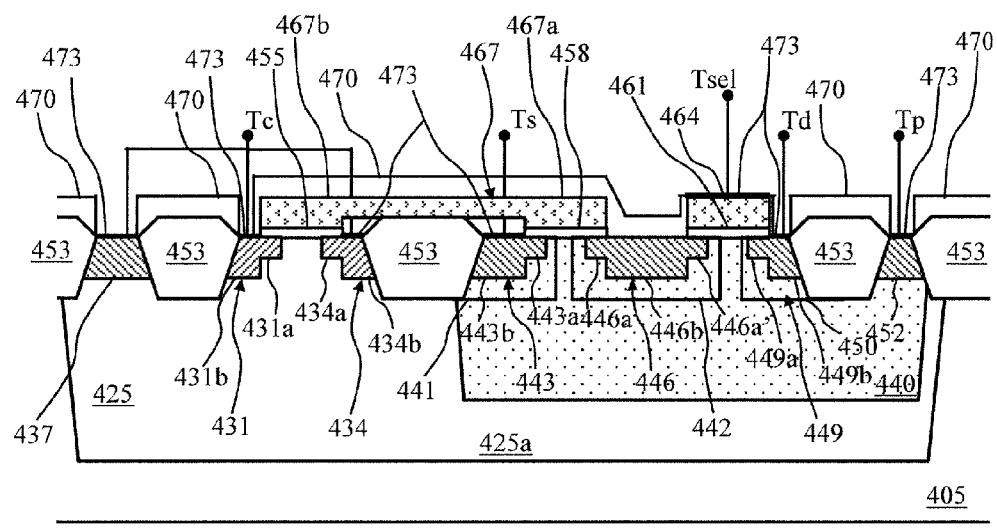
FIG. 4B is a schematic cross-sectional view of the memory cell of FIG. 4A.

Turning now to FIGS. 4A and 4B, a memory cell 400 according to an alternative embodiment is illustrated.

The memory cell 400 differs from memory cell 200 as follows (note that elements of the memory cell 400 corresponding to elements of the memory cell 200 are indicated by similar references and their description is not repeated for sake of brevity).

The program/read portion of the memory cell 400 further comprises a selection transistor 420 coupled with the memory transistor 415. In one embodiment, the selection transistor 420 is formed with dimensions substantially greater than the size of the memory transistor 415. For example, a width W20 of the channel region of the selection transistor 420 is substantially greater than a width W15 of the channel region of the memory transistor 415 (e.g., W20≥1.5×W15). Inside the p well 440, together with the regions 443, 446, and 452, is also formed a n+ doped region 449. Furthermore, the region 446 is shared by the selection transistor 420 and by the memory transistor 415 (as corresponds to the drain region of the memory transistor 415 and the source region of the selection transistor 420) and is hereinafter referred to as the shared region 446 for the sake of brevity. The region 449 is referred to as (selection) drain region 449 (as it corresponds to the drain region of the selection transistor 420).

Preferably, the source regions 443 and 446 each comprise a shared extension portion 443a and 446a, which extend towards each other in the proximity of the surface 428, and have an n-type doping—referred to as doping n* in the following—greater than the n+ doping of a main portion 443b and 446b of the regions 443 and 446, respectively. Advantageously, also the drain region 449 is formed in a respective protective region 450 and may be provided with an extension portion which extends towards a further extension portion of the shared region. In one embodiment, also the drain region comprises an extension portion 449a which extends from a main portion 449b toward an additional extension portion 446a' of the shared region 446.

A selection insulating layer 461 of electrically insulating material is formed on the surface 428 of the chip (in addition to the insulating layers 455 and 458), in a space above it, and substantially delimited, the regions 446 and 449 (so as to form the oxide layer of the selection transistor 420). A polysilicon gate layer 464 is formed over the selection insulating layer 461 (so as to form the gate region of the selection transistor 420).

In this case, one or more oxide layers 470 (e.g., a layer of silicon oxide and/or silicon nitride) are formed so as to cover (and electrically insulating) floating layer 467, the gate layer 464 and the insulating layers 455, 458 and 461. The floating layer 467 is electrically insulated from what formed in the substrate 405 because of the oxide layers 470.

In correspondence of the regions 437, 431, 434, 443, and 449 and the gate layer 464 respective layers of salicide 473 of a metallic material (e.g., cobalt defined as transition metal) are formed in order to facilitate a subsequent electrical connection with metal components for electrical connection formed later through higher levels of metallization.

The regions 437, 431, 434, 443, 452 are connected to the upper metallization layers (shown schematically by a line in FIG. 4B) in a similar manner to that described above. Otherwise, the drain terminal Td is now connected to the drain region 449 instead of the shared region 446 (which is not connected to any terminal). Furthermore, the gate region 464 is connected to a selection terminal Tsel in order to be able to be electrically connected to external elements to the memory cell 200 (e.g., to the row decoder 115r and the column decoder 115c shown in FIG. 1).

Table 2 below is an example of biasing schemes applicable to terminals Tc, Ts, Td, Tp and Tsel of the memory cell 200 according to the selected operation between erase, program and read operations.

TABLE 2

|  | Tc | Tp | Tsel | Ts | Td |
|---|---|---|---|---|---|
| Erase | Ve | GND | GND | GND | GND |
| Program | Vp | GND | Vselp | GND | Vdp |
| Read | Vr | GND | Vselr | GND | Vdr |

In the memory cell 400 in order to perform the program operation and the read operation the selection transistor 415 may be enabled. During such operations, to enable the selection transistor 415, the gate region 464 of the latter is biased to a selection voltage Vselp, in program, or to a read voltage Vselr, in read (e.g., corresponding to the supply voltage Vdd) through the selection terminal Tsel, while the drain region 449 is biased, via the drain terminal Td, to a drain program voltage Vdp, in program, or to a drain read voltage Vdr, in read, (for example, next to the value of the supply voltage Vdd, but lower than the selection voltage Vselp/read voltage Vselr, such as Vdp/Vdr=Vdd−1V) during the program operation, or to the value of the read voltage Vdr during the read operation.

Advantageously, the width W20 of the channel region of the selection transistor 420 substantially greater than the width W15 of the channel region of the memory transistor 415, causes the selection voltage Vselp/the read voltage Vselr fall predominantly between the region shared 446 and the source region 443 of the memory cell 400 (as it should be apparent to one skilled in the art).

During the program operation, this allows the obtaining of a potential drop between the shared region 446 and the source region 443 to stimulate CHE with a drain program voltage Vdp value reduced with respect to a memory cell in which the transistors have the same size (and therefore share substantially equally the drain program voltage Vdp among the terminals 443, 446 and 449). Similarly, during the read operation it is possible perform a read access to the memory cell 400 by imposing a drain read voltage Vdr value reduced with respect to a memory cell in which the transistors have the same sizes.

The charge carriers injected into the floating layer 467 during the program operation move the threshold voltage of the memory transistor 415 to a program value $Vth_{prog}$ greater than a thermal equilibrium value (i.e., $Vth_{prog} > Vth_{eq}$). Otherwise, the charge carriers extracted from the floating layer 467 during the erase operation move the threshold voltage of the memory transistor 415 to an erase value $Vth_{erase}$ lower than the thermal equilibrium value (i.e., $Vth_{erase} < Vth_{eq}$). The greater the distance between the erase values $Vth_{erase}$ and program value $Vth_{prog}$, the greater is the duration for which a logic value remains stored in the memory cell 400.

The selection transistor 420 makes it possible to extract a quantity of charge carriers from the floating layer 467 such as to determine a erase value $Vth_{erase}$ (virtually) negative for the memory transistor 415 without causing the memory cell 400 to be unreadable (as would happen if the selection transistor 420 was omitted). This allows a distance between the erase value $Vth_{erase}$ and the program value $Vth_{prog}$ such as to ensure high reliability of the memory cell 400 (e.g., ensuring a retention of a logic value stored in the order of about ten years) to be obtained.

Referring to FIGS. 5A-5L, steps of a manufacturing process of a memory cell 200 schematically illustrated in these figures is now described. Initially (FIG. 5A), the decoupling elements 253 at the surface 228, and then the n well 225 are formed. A layer of photosensitive material, or resist, is deposited on the surface 228 of the p substrate 205, a portion of the resist (corresponding to a plan view of the decoupling layer 253) is defined by a mask (not shown) and is impressed by an electromagnetic radiation (which passes through the mask). The impressed portion of the resist is selectively removed (e.g., via a chemical etching) so as to leave exposed a portion of the surface 228 of the substrate 205 corresponding to the plan view of the decoupling elements 253 to be formed. An insulating layer disposed on the surface 228 is removed from the portion of the surface 228 defined by the mask. At this point, the decoupling elements 253 are formed, for example by an etching process, to define the trenches, which are filled with insulating material by a chemical vapor deposition (CVD).

The n well 225 is formed in the p substrate 205. For example, the n well 225 may be formed as it is known by a photolithography process (in a similar way to that described above) followed by a ion implantation and diffusion process in a selected area of the portions of the chip not covered by the decoupling layer 253. Preferably, the deep region 225a of the n well 225 is formed by ion implantation.

Figure 5A:
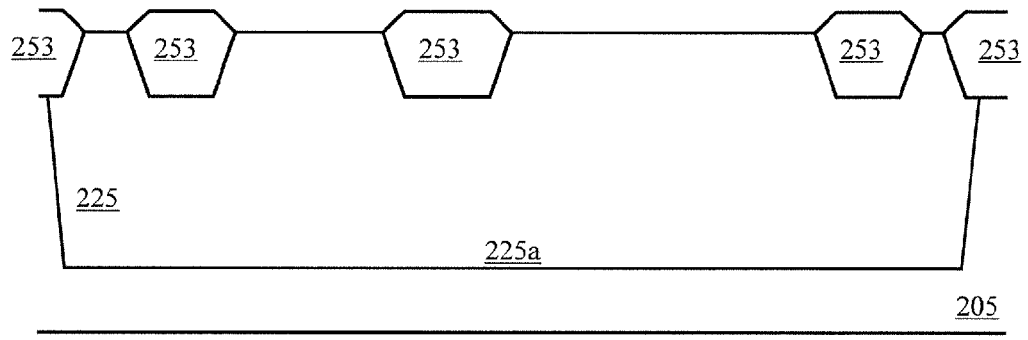
FIGS. 5A-5L illustrate schematically some steps of a manufacturing process of the memory cell of FIG. 2A.
Figure 5B:
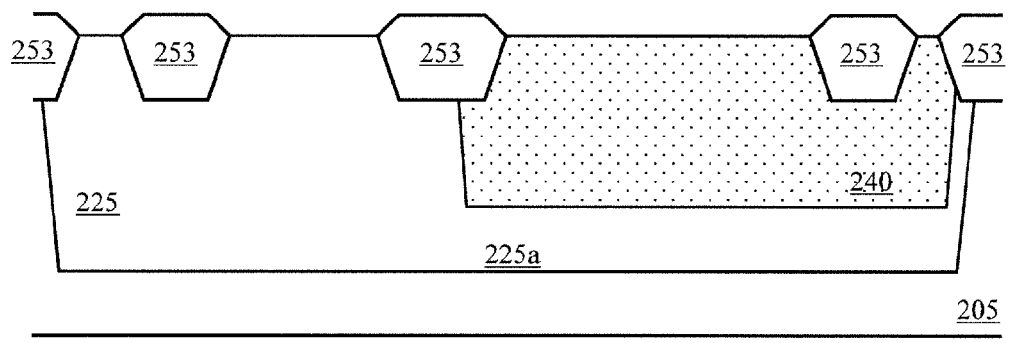
Figure 5C:
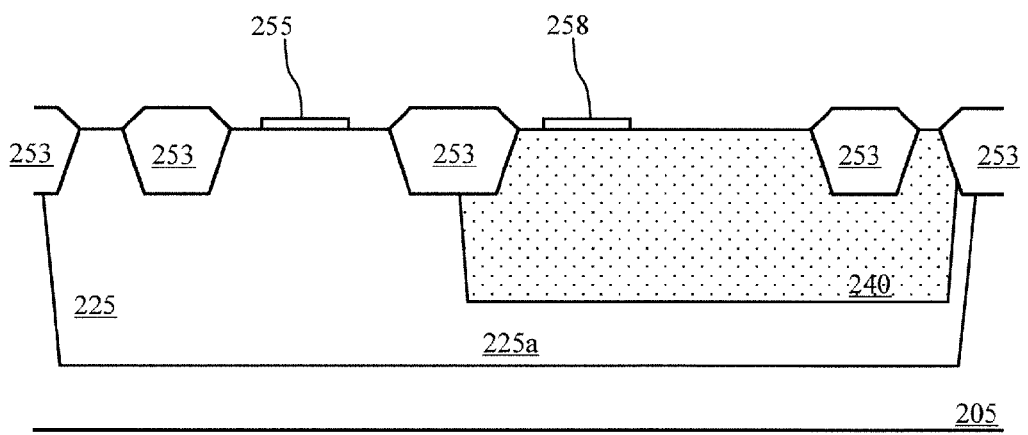

Next (FIG. 5B), the p well 240 is formed inside the n well 225 in the same manner as just described with respect to the formation of the latter. On the surface 228 of the substrate 205 are formed the insulating layers 255, 258 and 261 (FIG. 5C). For example, it is initially formed an oxide layer (or more) by CVD and/or by thermal oxidation. Selected portions of the oxide layer (e.g., again through photolithography) are then removed (e.g., again through a chemical etching) so as to define the insulating layers 255, 258 and 261.

Figure 5D:
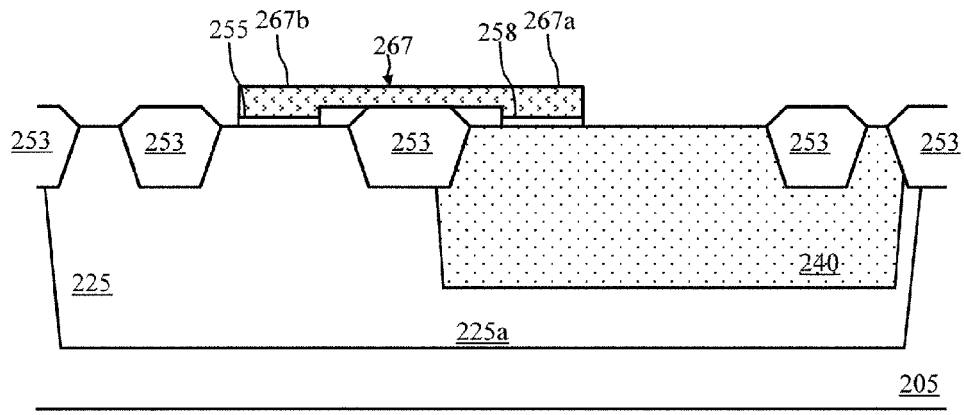

The floating layer 267 is formed over the insulating layers 255 and 258 (FIG. 5D). For example, the floating layer 267 is formed via a step of CVD.

Figure 5E:
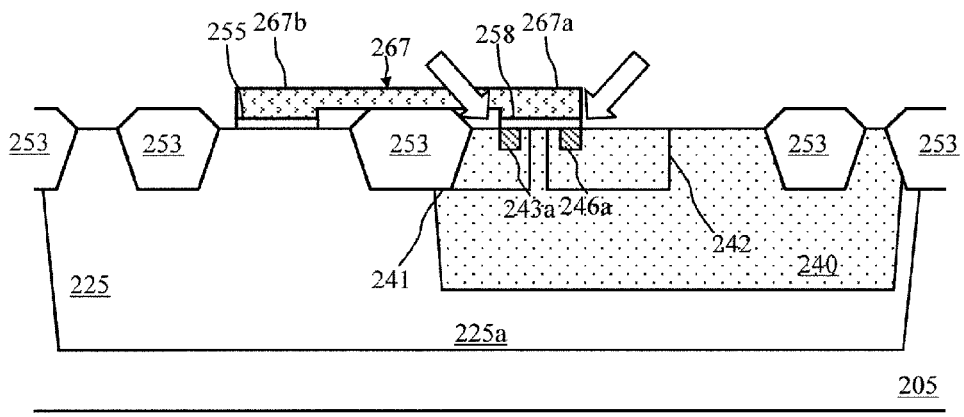

Protection regions 241 and 242 of the p* type are formed (FIGS. 5E and 5F), for example, through a ion implantation process in the n well 225 and in the p well 240. The protection regions 241 and 242 of the p* type are formed and the extension portions 243a and 246a of the n* type of the regions 243 and 246 (FIG. 5E). For example, the protection regions 241 and 242 and the extension portions 243a and 246a may be formed by ion implantation having an angle of incidence transversal to the surface 228 (as indicated by the arrows in FIG. 5E) and exploit the floating layer 267 and the gate layer 264 as self-aligning elements.

Figure 5F:
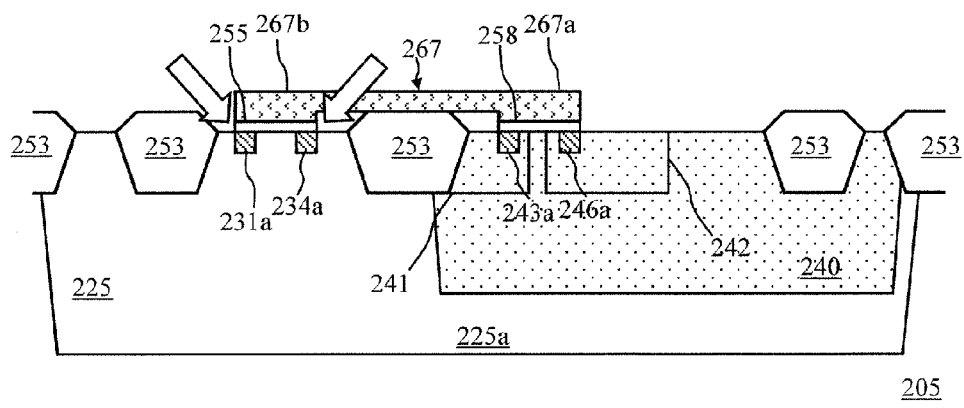

After the extension portions 243a and 246a extension portions 231a and 234a of the p* type of the regions 231 and 234 are formed (FIG. 5F). For example, the extension portions 243a and 246a may be formed by an ion implantation having an angle of incidence transversal to the surface 228 (as indicated by the arrows in FIG. 5F) and exploiting the floating layer 267 as self-aligning element (as described above). At this point, the floating layer 267, the gate layer 264 and the underlying insulating layers 255 and 258, respectively, are subjected to an oxidation process (e.g., thermal oxidation) in order to be covered by an insulating spacer layer (or spacer, not illustrated in the figures for simplicity) formed on side surfaces of the same.

Figure 5G:
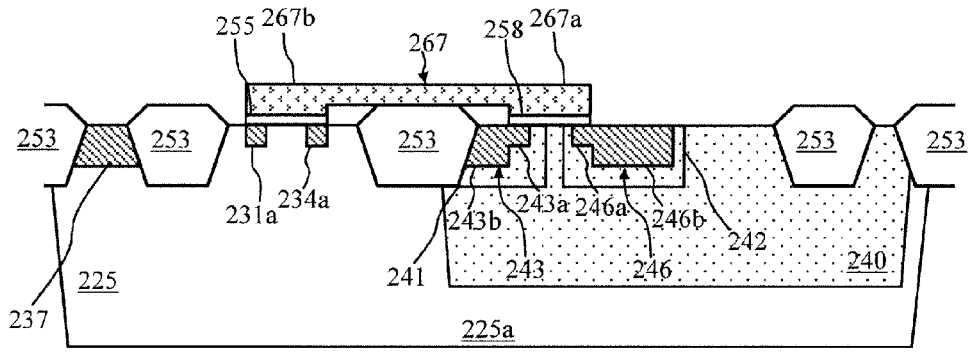
Figure 5H:
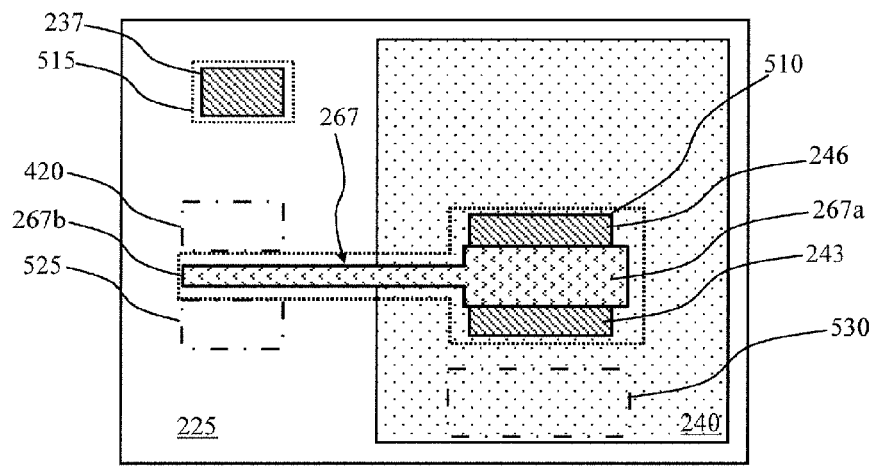

Subsequently, the regions 237 are formed, and the main portions 243b, 246b of n+ type of the regions 243 and 246 (FIGS. 5G and 5H). For example, the region 237, and the main portions 243b, 246b may be formed through a ion implantation process in the n well 225 and in the p well 240.

In one embodiment (FIG. 5H), the main portions 243a, 246a can be defined by exploiting the floating layer 267 (and the relative insulating spacer layer) as self-aligning elements, therefore with the possibility of using a single mask 510 to define the main portions 243a, 246a, while a further mask 515 is used to define the n+ contact region 237.

It should be noted that also the floating layer 267 receives a n+ type doping during this phase of the process. Advantageously, the mask 510 is designed so that the entire floating layer 267 is exposed uniformly to the same n+ type doping by ion implantation (in other words, the floating layer 267 has a polysilicon with the same n+ type doping from the transistor portion 267a to the capacitor portion 267b). In this way, it is possible to form the floating layer 267 without spurious pn junctions and therefore without requiring the deposition of a layer of silicide on the conductive floating layer 267.

Figure 5I:
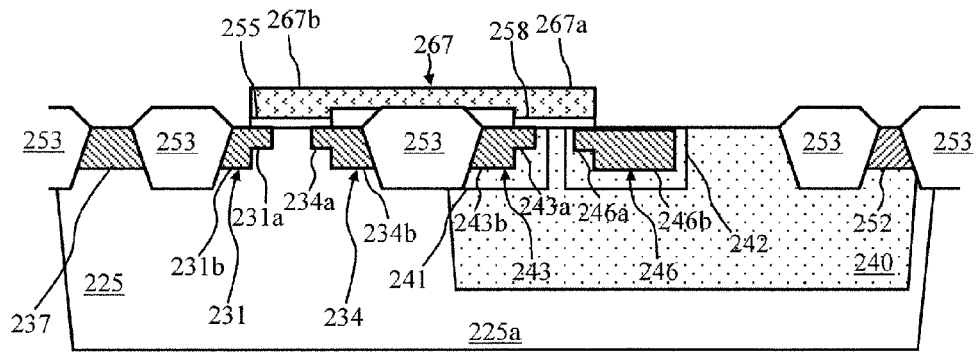
Figure 5J:
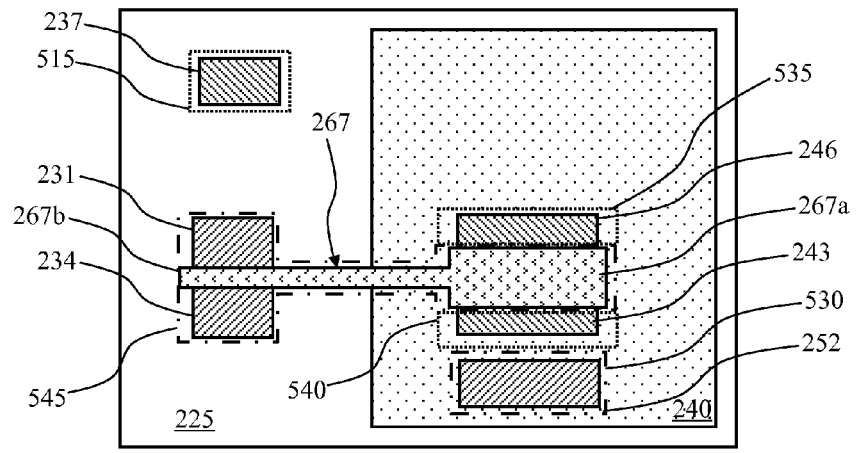

Subsequently the p+ contact region 252 and the main portions 231b and 234b of the plate regions 231 and 234 of the p+ type are formed (FIG. 5I). For example, the p+ contact region 252 and the main portions 231b and 234b can be formed by ion implantation through areas of the surface 228 defined by masks 520, 525 and 530 (illustrated in FIG. 5H) in a similar manner to that described above.

In an alternative embodiment according to the present invention (FIG. 5J), the main portion 243b and the main portion 246b are each one defined by a respective mask 535 and 540. The main portions 231b and 234b may be defined exploiting the floating layer 267 as a self-aligning element through a single mask 545.

It should be noted that, in this case, the floating layer 267 receives a p+ type doping during this phase of the process. Advantageously, the mask 545 is designed so that the entire layer float 267 is exposed uniformly the same p+ type doping through ion implantation (in other words, the floating layer 267 has a polysilicon with the same p+ type doping from the transistor portion 267a to the capacitor portion 267b).

Figure 5K:
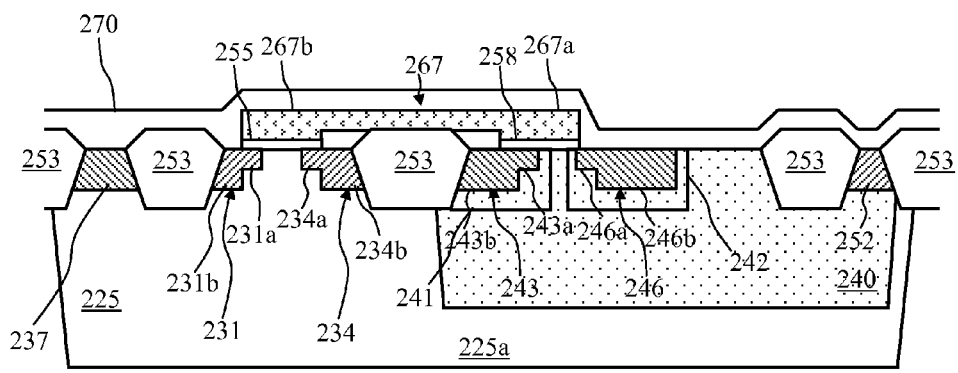

The surface 228 of the substrate 205, the floating layer 267, and the insulating layers 255 and 258 are then covered by one or more oxide layers 270 (e.g., a layer of silicon oxide and/or silicon nitride), for example by thermal oxidation and/or CVD (FIG. 5K). In this way, the layer 267 is electrically isolated from floating as formed in the substrate 205.

Figure 5L:
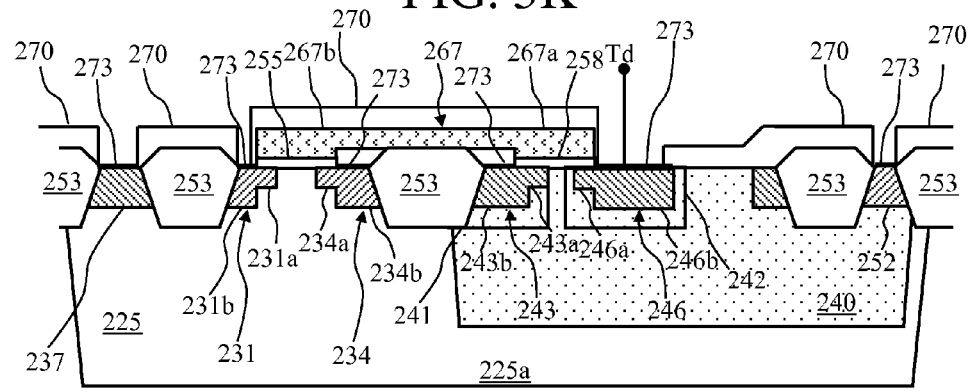

The oxide layers 270 are selectively removed (e.g., by chemical etching) in correspondence of the regions 237, 231, 234, 243, and 246, which are then subjected to a silicidation process (FIG. 5L). The silicidation deposits the salicide layer 273 in a transition metal (e.g., cobalt) on the surface 228 in correspondence of the regions 237, 231, 234, 243, and 246 in order to facilitate a subsequent electrical connection with metal elements for electrical connection to higher levels of metallization afterwards formed to providing the terminals Tn, Tc, Ts, Td, Tp and Tsel previously described.

Similar steps are implemented to manufacturing the memory cell 300, mutatis mutandis, in particular, it is formed only plate region 331, instead of the two plate regions 231 and 234 of the memory cell 200. Also the memory cell 400 may be implemented with similar steps as described, mutatis mutandis. In particular, the insulating layer 261, the drain region 249 and the gate layer 264 are made simultaneously with and in a similar way to the regions and made of similar material with dopings.

Figure 6:
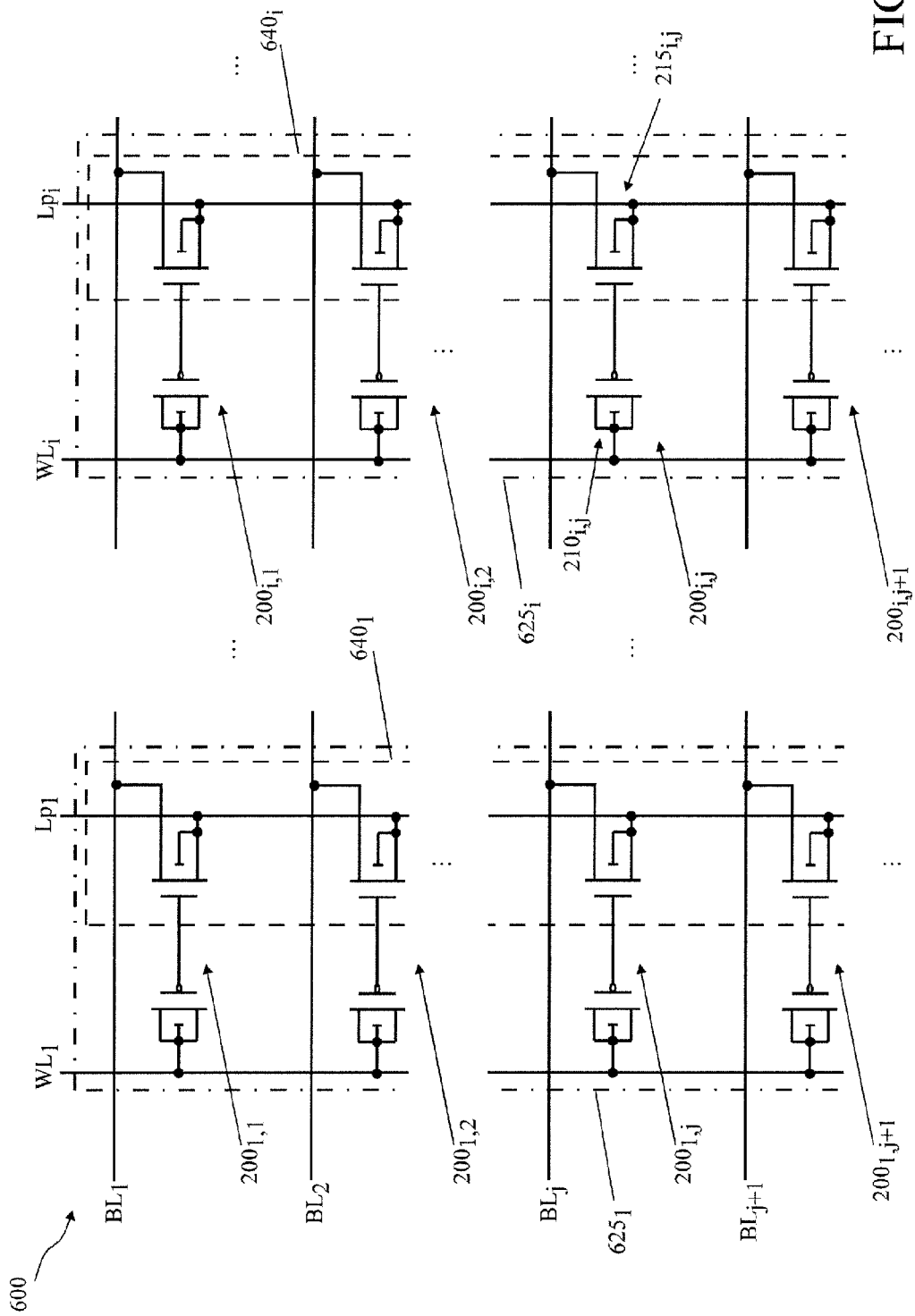
FIG. 6 is a circuit diagram of a portion or sector of the array of memory cells according to an embodiment of the present invention.

With reference now to FIG. 6, a circuit diagram of a portion, or sector 600, of an array 105 of memory cells $200_{i,j}$ according to an embodiment is illustrated. The array 105 comprises a plurality of memory cells $200_{i,j}$ organized in columns i (i=1, ..., I, I>0) and rows j (j=1, ..., J, J>0). The plurality of memory cells $200_{i,j}$ is preferably divided into groups or sectors (of which the sector 600 in FIG. 6 is an example) of the memory cell $200_{i,j}$. The control portions (i.e., the capacitive element $210_{i,j}$) of the memory cells $200_{i,j}$ sector 600 aligned along the same column are formed in a same shared n well $625_i$ (corresponding to the n well 225 illustrated in FIGS. 2A and 2B). The memory cells $200_{i,j}$ in the sector 600 (as well as of the remaining matrix 105) are arranged substantially in an arrangement known in the art under the name "NOR".

In each shared n well $625_i$ a shared p well $640_i$ is formed (corresponding to the p well 240 illustrated in FIGS. 2A and 2B) by the program/read portions of the memory cells $200_{i,j}$ (i.e., the memory transistor $215_{i,j}$) aligned along the same column of the matrix 105. In the generic shared p well $640_i$, are formed the memory transistor $215_{i,j}$, the selection transistor $220_{i,j}$ and the p+ contact regions $252_{i,j}$ of the memory cells $200_{i,j}$ aligned on the column. Preferably, a single contact region of the well (not shown) may be formed in each p well $640_i$ for biasing the same.

The well terminals $Tp_{i,j}$ (related to p+ contact the region/s $252_{i,j}$) and the source terminals of $Ts_{i,j}$ (connected to the source regions $243_{i,j}$) of the memory cells $200_{i,j}$ aligned on the line j, are connected to a same line of well $Lp_i$ (for example connected to the row decoder 115r).

The drain terminals $Td_{i,j}$ (connected to the drain regions $246_{i,j}$) of the memory cells $200_{i,j}$ aligned on the row j are connected to the same bit line BLj (e.g., connected to the column decoder 115c). The control terminal $Tc_{i,j}$ of each memory cell $200_{i,j}$ is connected to a respective word line WLi (e.g., connected to the row decoder 115r). Preferably, each memory cell $200_{i,j}$ aligned on a same column is connected to the same word line WLi.

In Table 3 below, biasing schemes similar to that reported in Table 1 are presented but applied to the signal lines $Lp_i$, $WL_i$ and $BL_j$ (connected to terminals $Tn_{i,j}$, $Tc_{i,j}$, $Ts_{i,j}$, $Td_{i,j}$ e $Tp_{i,j}$ of the memory cells $200_{i,j}$).

TABLE 3

|  | WLi | $Lp_i$ | BLj |
|---|---|---|---|
| Erase | Ve | GND | GND |
| Program | Vp | GND | Vp |
| Read | Vr | GND | Vd |

Because of the structure of the matrix 105 described above it is possible to execute a program with a granularity of a single memory cell $200_{i,j}$ (i.e., you can execute the program s of a single memory cell $200_{i,j}$ selected), while the erase operation is the granularity of the word (i.e., the operation is performed to erase all memory cells $200_{i,j}$ aligned on a same column the same time) or sector 600.

The erase of a word is obtained by applying the erase biasing scheme to the memory cells $200_{i,j}$ of the same word (biasing to the erase voltage Ve value the corresponding word line $WL_i$ and maintaining to the reference value GND the other word lines $WL_x$, with x different from i). Alternatively, the entire sector may be erased by applying the biasing scheme to all the memory cells $200_{i,j}$ of the sector (biasing to the erase voltage Ve value each word line $WL_i$ of the sector 600).

Advantageously, by applying the program biasing scheme to a memory cell of the sector 600 (i.e., by applying the program voltage Vp value to the bit line $BL_j$ and the program voltage Vp value to the word line $WL_i$ of the selected cell, while maintaining to the reference value GND the other bit line BL$_y$, with y different from j, and the word lines WL$_x$, with x different from i) it is possible to perform the program operation limited thereof.

The reading of the logic values stored in each memory cell 200$_{i,j}$ in the sector 600 may be performed cell by cell by applying the read biasing scheme to signal lines WL$_i$ and BL$_j$ connected to a selected memory cell 200$_{i,j}$. Alternatively, an entire word of the sector 600 may be read by applying the read biasing scheme to the signal lines WL$_i$ and BL$_j$ connected to the memory cells 200$_{i,j}$ of the selected word.

Advantageously, the structure of the memory cell 200$_{i,j}$ allows the use of voltage values Vp, Vr, and Vd lower than or equal to the value of the supply voltage Vdd, thus obtainable without the need to exploit voltage multipliers devices such as charge pumps. In this way, only the word line WL$_i$ is dimensioned so as to operate with a voltage value Ve greater than the value of the supply voltage Vdd. In other words, only the word line WL$_i$ must be subjected more stringent design constraints, in order to operate properly to the voltage Ve. This also enables a general reduction of the complexity of the circuitry comprised in the row decoder 115$r$, in the column decoder 115$c$ and the drive read/write unit 120 (only the word lines WL$_i$ have be connectable to an element able to bias them to high voltage as a high voltage driver) thereby allowing a further area saving.

It should be noted that it is possible to implement a matrix 105 alternative (not shown) comprising a plurality of memory cells 300 in the same way as just described in relation to FIG. 6, mutatis mutandis. Also in this case it is possible to obtain the same advantages described above, in addition to the more compact structure of the memory cell 300 further reduces an area consumption of the emNVM 100 for the same quantity of data that can be stored. Because of the arrangement of the memory cells 200$_{i,j}$ within the sector 600, the control matrix 105 is simple and versatile.

Figure 7:
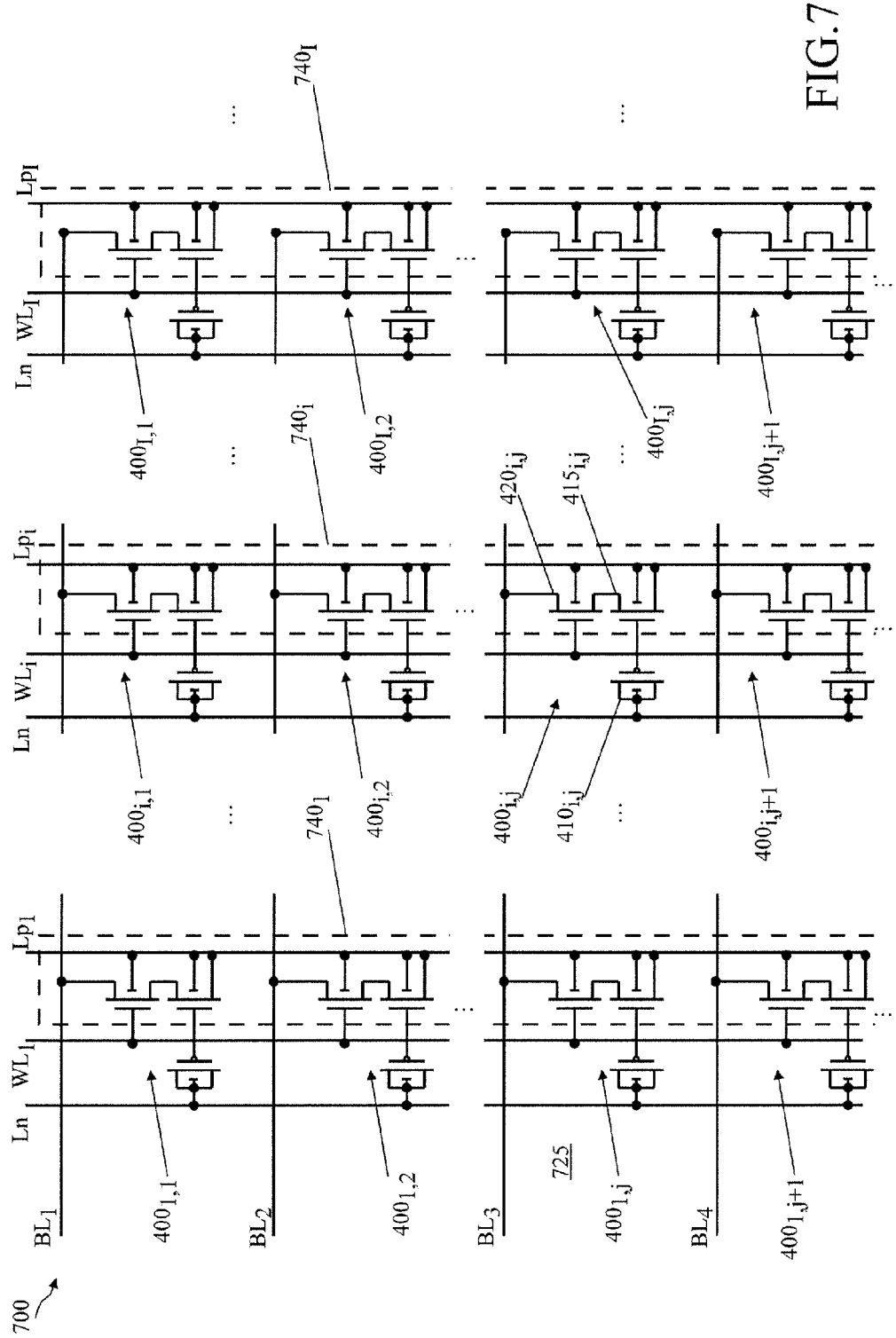
FIG. 7 is a circuit diagram of a portion or sector of the array of memory cells according to an alternative embodiment of the present invention.

Turning now to FIG. 7, a circuit diagram of a portion, or sector 700, of an matrix 105 of memory cells 400$_{i,j}$ according to an embodiment is illustrated. The sector 700 differs from the sector 600 described above as follows.

The erase portions (i.e. the capacitive elements 410$_{i,j}$) of all the cells of the sector 700 are formed in a same shared well 725 (corresponding to the n well 425). The program/read portions (i.e. the transistors 415 and 420) of the memory cells 400$_{i,j}$ aligned along a same column i are formed in a respective shared p well 740$_i$ (corresponding to the p well 440).

The control terminal Tc of each capacitive element 410$_{i,j}$ of each memory cell 400$_{i,j}$ in the sector 700 is connected to a n well (signal) line Ln. The drain terminal Td of the selection transistor 420$_{i,j}$ is connected to the bit line BL$_j$ shared by all memory cells 400$_{i,j}$ aligned along the same row j. The selection terminal Tsel of the selection transistor 420$_{i,j}$ is connected to the word line WL$_i$ shared by all memory cells 400$_{i,j}$ aligned along the same column i.

The biasing scheme of the signal lines of the sector 700 is modified with respect to the biasing scheme presented in Table 3, as shown below in Table 4.

TABLE 4

|  | WL$_i$ | Ln | Lp$_i$ | BL$_j$ |
| --- | --- | --- | --- | --- |
| Erase | GND | Ve | GND | GND |
| Program | Vselp | Vp | GND | Vdp |
| Read | Vselr | Vr | GND | Vdr |

In this case, the erase operation is applied to all memory cells 400$_{i,j}$ of the sector 700 at the same time, simply by applying the erase voltage Ve value to the n well line Ln and maintaining to the reference value GND the other signal lines (thereby obtaining a fast erase of the entire sector 700). Otherwise, to perform the read and program operations of a selected memory cell 400$_{i,j}$ is necessary to enable the same by activating the respective selection transistor 420$_{i,j}$ by the respective values of the selection voltage Vselr/Vselp (e.g., corresponding to the value of the supply voltage Vdd) applied to the word line WL$_i$ and by applying the value of the read voltage Vr or the value of the program voltage Vp to the n well line Ln, respectively (thereby obtaining read and program operations with a granularity corresponding to a single memory cell 400$_{i,j}$).

The emNVM 100 according to one embodiment of the present invention may be configured for storing data in differential mode. This mode allows a higher reliability of the correctness of the data stored than the normal storage mode.

According to the differential mode data is stored each configuring a complementary logic values in a pair of memory cells (e.g., the memory cells 400$_{1,1}$ and 400$_{i,j}$). The data associated with each pair of memory cells 400$_{1,1}$ and 400$_{i,j}$ is determined by comparing the currents generated by the memory cells 400$_{1,1}$ and 400$_{i,j}$ of the pair during the read operation.

The emNVM 100 may effectively implement the differential storage mode because of the distance between the erase value Vth$_{erase}$ and the program value Vth$_{prog}$ mentioned above, which allows to obtain generated currents of the memory cells 400$_{1,1}$ and 400$_{i,j}$ of the pair having substantially different intensities. In this way, the comparison between the currents generated by the memory cells 400$_{1,1}$ and 400$_{i,j}$ of a pair is less prone to errors, thereby improving the read efficiency of the emNVM 100 (at the same time, relaxing the design constraints to which an element of comparison of current, such as a sense amplifier is subjected).

Because of the structure of the field 700 described above, it is possible to implement a compact matrix 105. Indeed, the structure of the sectors 700, in which the erase portions of the memory cells 400$_{i,j}$ are formed in the same p well 725 shared (rather than in a dedicated p well), allows to maintain reduced a pitch between cells memory 400$_{i,j}$ aligned along the same column of the matrix 105.

Also, form the erase portions of the memory cells 400$_{i,j}$ in the same shared p well 725 enables a general reduction of the complexity and size of the circuitry comprised in the row decoder 115$r$, in the column decoder 115$c$ and in the read/write unit 120. In fact, only the (shared) n well signal line Ln have to be connected to an element able to bias them to high voltage (such as a High Voltage Driver) thereby allowing a further saving of global area of the emNVM 100. In other words, at the price of increasing the area occupied by each memory cell 400$_{i,j}$ providing the selection transistor 420$_{i,j}$ is possible to obtain a reduction of occupancy of global area of the matrix 105, because of the reduced pitch between the cells of memory 400$_{i,j}$ and the simplification of the circuitry of the row decoder 115$r$, the column decoder 115$c$ and the read/write unit 120.

Figure 8:
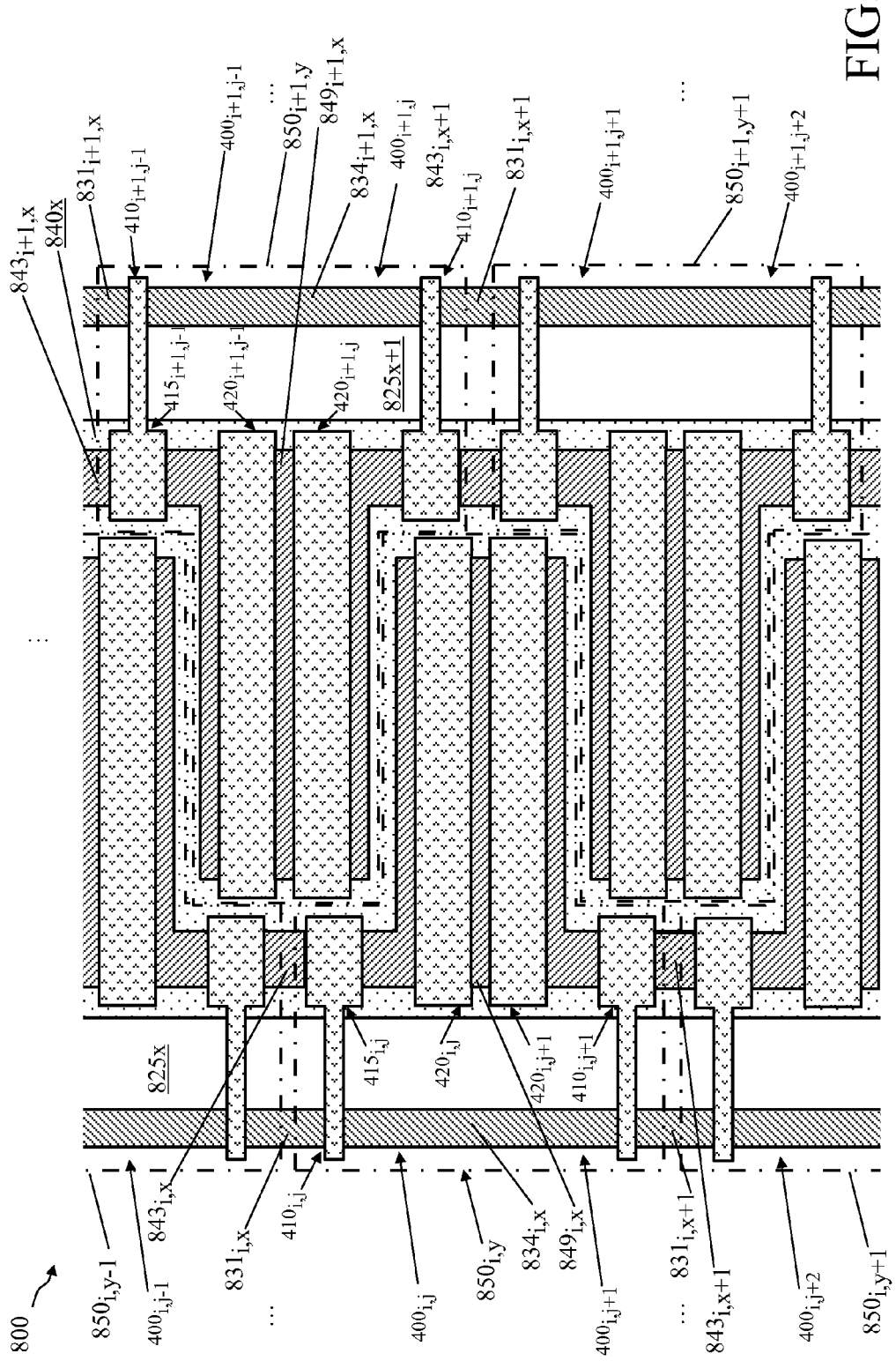
FIG. 8 is a schematic plan view of a portion or sector of an array of memory cells according to an embodiment of the present invention.

Turning now to FIG. 8, a plan view schematic of a portion, or sector 800, an array 105 of memory cells 400$_{i,j}$ according to an embodiment is illustrated. The sector 800 differs from the sector 700 as follows.

In a shared well 825 is formed in a p well 840$_x$ (corresponding to the p well 440 illustrated in FIGS. 4A and 4B) shared by pairs of columns i and i+1 row in the matrix 105 (then x = 1, . . . , X; X=I/2).

Within the sector 800, the memory cells $400_{i,j}$ are formed according to a highly symmetric arrangement, which allows to obtain a compact structure of the sector 800.

In one embodiment of the present invention, in each generic memory cell $400_{i,j}$, the memory transistor $415_{i,j}$ shares a shared source region $843_{i,y}$ (y=1, ..., Y; Y=J/2) with the memory transistor $415_{i,j-1}$ (in other words, the source region or $443_{i,j}$ corresponds to the source region $443_{i,j-1}$). Similarly, each selection transistor $420_{i,j}$ of the generic memory cell $400_{i,j}$ alternately shares a shared drain region $849_{i,y}$ with the selection transistor $420_{i,j+1}$ of the memory cell $400_{i,j+1}$ which occupies a next position in the column (in other words, the drain region $449_{i,j}$ corresponds to the drain region $449_{i,j+1}$).

The control portions (i.e., the capacitive elements $410_{i,j}$) of the memory cells $200_{i,j}$ are formed in sub-regions $825_x$ and $825_x+1$ of the shared n well 825 separated by the shared p well $840_x$. The capacitive elements $410_{i,j}$ of the memory cells $400_{i,j}$ aligned on the column i are formed in a sub-region $825_x$ of the shared n well 825 delimited by p well $840_{x-1}$ (not shown) and $840_x$. The capacitive elements $410_{i,j+1}$ of the memory cells $400_{i,j+1}$ aligned on the column i+1 are formed in a sub-region $825_{x+1}$ of the shared n well 825 delimited by pockets p $840_x$ and $840_{x+1}$ (not shown). Furthermore, the capacitive elements $410_{i,j}$ share shared plate regions $831_{i,y}$, and $834_{i,y}$ with the capacitive elements $410_{i,j-1}$ and $410_{i,j+1}$, respectively, aligned along the same column i.

In one embodiment, the symmetrical arrangement of the memory cells $400_{i,j}$ and $400_{i,j+1}$ just described allows identifying a plurality of elementary clusters $850_{i,y}$ aligned in sequence along the respective shared p well $840_x$, each comprising two memory cells. For example the memory cells $400_{i,j}$ and $400_{i,j+1}$ which read/program portions are formed in a shared same p well $840_x$ form the generic cluster $850_{i,y}$.

The selection transistors $420_{i,j}$ and $420_{i,j+1}$ of the memory cells $400_{i,j}$, and $400_{i,j+1}$ (aligned on the same column) of the cluster $850_{i,y}$ share the shared drain region $849ay$, while the memory transistors $415_{i,j}$ and $415_{i,j+1}$ share the shared source region $843_{i,y}$ with the (previous) memory transistor $415_{i,j-1}$ of the previous cluster $850_{i,y-1}$ and the shared source region $843_{i,y+1}$ with the (next) memory transistor $415_{i,j+1}$ of the next cluster, $850_{y+1}$. The capacitive elements $410i,j$ and $410_{i,j+1}$ share a shared plate region $834_{i,y}$, and shared plate regions $834_{i,y}$ and $834_{i,y+1}$ with the capacitive elements $410_{i,j-1}$ of the previous cluster $850_{i,y-1}$ and $410_{i,j+1}$ of the next cluster $850_{i,y+1}$, respectively.

Similarly, the memory cells $400_{i+1,j}$ and $400_{i+1,j+1}$ (aligned along the column i+1 of the matrix 105) which program/read portions are formed in a same shared p well $840_x$ form the generic specular cluster $850_{i+1,y}$ in a completely corresponding way to what described above for the cluster $850_{i,y}$ (and therefore not repeated for sake brevity).

Advantageously each generic cluster $850_{i,y}$ is specular to the generic cluster specular $850_{i+1,y}$, in this way it is possible to obtain a very compact arrangement of the read/program portions within the generic shared well $840_i$ with the selection transistors $420_{i,j}$, $420_{i,j+1}$ of a cluster $850_{i,y}$ interdigitated with corresponding selection transistors $420_{i+1,j}$, $420_{i+1,j+1}$ of the specular cluster $850_{i+1,y}$. This allows a further reduction of area to implement the matrix 105.

In sector 800, the memory cells $400_{i,j}$ and $400_{i,j+1}$ of a same cluster $850_{i,y}$ (i.e., that share the common drain region $849_{i,y}$) are connected to the same bit line $BL_y$. In order to allow program and read operations of each memory cell $400_{i,j}$, the selection terminal $Tsel_{i,j}$ of each generic memory cell $400_{i,j}$ of the column is connected to a respective word line $WLa_i$ or $WLb_i$ (not shown, for example, connected to the column decoder 115c). Preferably, each memory cell $400_{i,j}$ aligned on the same column is connected to a word line $WLa_i$ or $WLb_i$ according to whether the memory cell $400_{i,j}$ is aligned on a odd or even line j, respectively (with each memory cell $400_{i,j}$ in the odd positions in the column connected to the same word line $WLa_i$ and each memory cell $400_{i,j}$ in even position in the column connected to the same word line $WLb_i$).

In an alternative embodiment (not shown), memory cells 300 are modified in order to comprise a selection transistor similar to the selection transistor 425 implemented in a matrix 105 with an arrangement similar to that described above, mutatis mutandis, obtaining the same advantages described above.

Moreover, the structures of non-volatile memory described above in relation to an embedded non-volatile memory may be implemented in a not embedded non-volatile memory without requiring substantial modifications.

The invention claimed is:

1. A non-volatile memory integrated in a semiconductor material chip, the non-volatile memory comprising:
   a plurality of memory cells arranged in rows and columns, each memory cell comprising
      a program/read portion,
      an erase portion, and
      an electrically floating layer comprising conductive material and coupling the program/read portion and the erase portion to define a first capacitive coupling with the program/read portion, and a second capacitive coupling with the erase portion,
   the program/read portion of each memory cell being formed in the semiconductor material chip in a first well of semiconductor material having a doping of a first type, the erase portion being formed in the semiconductor material chip in a second well of semiconductor material having a doping of a second type,
   the program/read portion being configured to be traversed by an electric current indicative of a logic value stored in a given memory cell during a read operation of the given memory cell,
   the first capacitive coupling defining a first capacitance greater than a second capacitance defined by the second capacitive coupling, the erase portion being configured to be traversed by an electric current configured to extract charge carriers from the electrically floating layer to store a first logic value in the given memory cell,
   the program/read portion being further configured to be traversed by an electric current configured to inject charge carriers in the electrically floating layer to store a second logic value, respectively, in the given memory cell.

2. The non-volatile memory according to claim 1, wherein the program/read portion is configured to perform the injection of charge carriers in the electrically floating layer through generation of channel hot electrons; and wherein the erase portion is configured to perform the extraction of charge carriers from the electrically floating layer through Fowler-Nordheim tunneling; and wherein a coupling factor defined by a ratio between the first capacitance and a sum of the first capacitance and the second capacitance is less than or equal to 0.5.

3. The non-volatile memory according to claim 1, wherein the program/reading portion comprises a transistor having a source region, a drain region and a first gate region; and wherein the erase portion comprises a capacitive element; wherein the electrically floating layer defines the first gate region of the transistor of the program/read portion and a first plate region of the capacitive element of the erase portion.

4. The non-volatile memory according to claim 3, further comprising a first contact region of semiconductor material having a doping of the first type in a first well; and wherein the transistor further comprises a source region of semiconductor material having a doping of the second type, a first well connecting line coupling the first contact region to the source region, a first insulating layer of electrically insulating material between the first gate region and the source region, and a drain region of semiconductor material having a doping of the second type; wherein the non-volatile memory further comprises a row connection line coupled to the drain region; wherein the transistor further comprises a second contact region of semiconductor material has a doping of the second type and in a second well; wherein the capacitive element comprises at least one second plate region; and wherein the electrically insulating material has a second insulating layer between the first plate region and the at least one second plate region.

5. The non-volatile memory according to claim 3, wherein the program/reading portion comprises a further transistor having a drain region of semiconductor material, and a source region, the transistor and the further transistor sharing a common region of semiconductor material having a doping of the second type corresponding to the drain region of the transistor and to the source region of the further transistor, the drain region having a doping of the second type; and wherein the non-volatile memory further comprises a row connection line coupled to drain region; wherein the further transistor further comprises a second gate region comprising conductive material and a second insulating layer comprising electrically insulating material between the second gate region and the drain and shared regions; and wherein the non-volatile memory further comprises a column line coupled to the second gate region and the second insulating layer.

6. The non-volatile memory according to claim 4, further comprising a column connecting line; and wherein the second contact region of semiconductor material having a doping of the second type and the at least one second plate region of the capacitive element are coupled together and with the column connecting line.

7. The non-volatile memory according to claim 5, wherein the transistor further comprises a second contact region of semiconductor material having a doping of the second type and in a second well and a second well connecting line coupled to the second contact region; wherein the non-volatile memory further comprises a column connecting line; and wherein the capacitive element comprises at least one second plate region coupled with the column connecting line.

8. The non-volatile memory according to claim 1, wherein program/read portions of the plurality of memory cells aligned along a same column of the matrix are in a respective shared well.

9. The non-volatile memory according to claim 7, wherein program/read portions of the plurality of memory cells aligned along pairs of adjacent columns are in a respective well, and wherein memory cells aligned on a same column alternately share the source region of the first transistor or the drain region of the further transistor with a memory cell in a previous position in a row of memory cells and alternately share the source region of the first transistor or the drain region of the further transistor with a memory cell in a next position in the row of memory cells.

10. The non-volatile memory according to claim 1, wherein the plurality of memory cells is divided into at least one sector, each comprising at least one portion of the plurality of memory cells, the at least one portion being in a same second well shared by memory cells in the at least one sector.

11. A non-volatile memory comprising:
a plurality of memory cells arranged in rows and columns, each memory cell comprising
a program/read portion,
an erase portion, and
an electrically floating layer comprising conductive material and coupling the program/read portion and the erase portion to define a first capacitive coupling with the program/read portion, and a second capacitive coupling with the erase portion,
the program/read portion of each memory cell being in a first well of semiconductor material having a doping of a first type, the erase portion being in a second well of semiconductor material having a doping of a second type,
the first capacitive coupling defining a first capacitance greater than a second capacitance defined by the second capacitive coupling, the erase portion being configured so that an electric current extracts charge carriers from the electrically floating layer,
the program/read portion being further configured so that an electric current injects charge carriers in the electrically floating layer.

12. The non-volatile memory according to claim 11, wherein a coupling factor defined by a ratio between the first capacitance and the sum of the first capacitance with the second capacitance is less than or equal to 0.5.

13. The non-volatile memory according to claim 11, wherein the program/reading portion comprises a transistor having a source region, a drain region and a first gate region; and wherein the erase portion comprises a capacitive element; wherein the electrically floating layer defines the first gate region of the transistor of the program/read portion and a first plate region of the capacitive element of the erase portion.

14. A method of making a non-volatile memory integrated in a chip of semiconductor material, the non-volatile memory comprising a plurality of memory cells arranged in a plurality of rows and columns, the method comprising:
providing the chip of semiconductor material;
forming a first well of semiconductor material having a doping of a first type in the chip;
forming a second well of semiconductor material having a doping of a second type in the chip; and
for each memory cell
forming a program/read portion in the first well configured to be traversed by an electric current indicative of a logic value stored in the memory cell during a read operation of the memory cell,
forming an erase portion in the second well, and
forming an electrically floating layer of conductive material to define a first capacitive coupling with the program/read portion and a second capacitive coupling with the erase portion,
wherein forming the electrically floating layer comprises forming the first capacitive coupling to define a first capacitance greater than a second capacitance defined by the second capacitive coupling,
wherein forming the erase portion comprises configuring the erase portion to be traversed by an electric current for extracting charge carriers from the electrically floating layer to store a first logic value in the memory cell,
wherein forming the program/read portion comprises configuring the program/read portion to be traversed by an electric current configured to extract charge carriers from the electrically floating layer to store a second logic value in the memory cell.

15. The method according to claim 14, wherein forming an electrically floating layer comprises:
    depositing a polysilicon layer corresponding to the electrically floating layer; and
    subjecting the entire polysilicon layer to a same doping of one of the first type and the second type so that the electrically floating layer has a uniform doping.

16. The method according to claim 14, wherein the method is performed using a standard complementary metal oxide semiconductor (CMOS) process apparatus.

17. A method of making a non-volatile memory comprising a plurality of memory cells arranged in a plurality of rows and columns, the method comprising:
    forming a first well of semiconductor material having a doping of a first type;
    forming a second well of semiconductor material having a doping of a second type; and
    for each memory cell
        forming a program/read portion in the first well,
        forming an erase portion in the second well, and
        forming an electrically floating layer of conductive material to define a first capacitive coupling with the program/read portion and a second capacitive coupling with the erase portion,
    wherein forming the electrically floating layer comprises forming the first capacitive coupling to define a first capacitance greater than a second capacitance defined by the second capacitive coupling,
    wherein forming the erase portion comprises forming the erase portion so that an electric current extracts charge carriers from the electrically floating layer,
    wherein forming the program/read portion comprises forming the program/read portion so that an electric current extracts charge carriers from the electrically floating layer.

18. The method according to claim 17, wherein forming the electrically floating layer comprises:
    depositing a polysilicon layer corresponding to the electrically floating layer; and
    subjecting the entire polysilicon layer to a same doping of the first type or of the second type so that the electrically floating layer has a uniform doping.

\* \* \* \* \*